Figure 1:
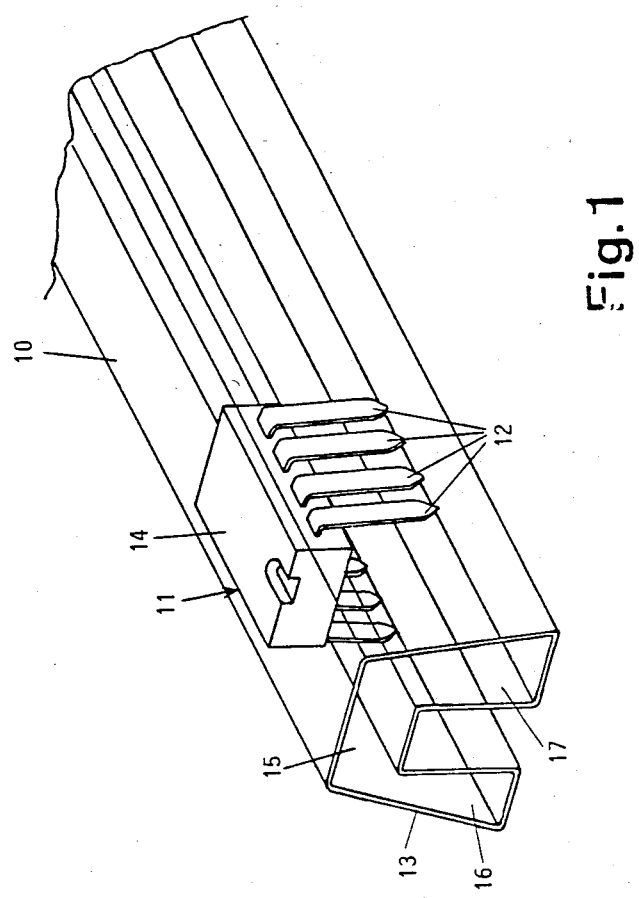

United States Patent [19]

Fischer

[11] Patent Number: 4,498,574
[45] Date of Patent: Feb. 12, 1985

[54] APPARATUS FOR ALIGNING TUBULAR TRANSPORT CONTAINERS HAVING A SUBSTANTIALLY U-SHAPED HOLLOW CROSS-SECTION FOR DIL HOUSING PRIOR TO THE EMPTYING OF SUCH TRANSPORT CONTAINERS

[75] Inventor: Georg Fischer, Inkofen, Fed. Rep. of Germany

[73] Assignee: Texas Instruments Incorporated, Dallas, Tex.

[21] Appl. No.: 404,789

[22] Filed: Aug. 3, 1982

[30] Foreign Application Priority Data

Aug. 7, 1981 [DE] Fed. Rep. of Germany ....... 3131317

[51] Int. Cl.³ ............................................. B65G 47/24
[52] U.S. Cl. .................................... 198/380; 198/394; 198/472; 198/493
[58] Field of Search ............... 198/380, 397, 484, 493, 198/394, 472; 221/156, 157, 171

[56] References Cited

U.S. PATENT DOCUMENTS

| | | | |
|---|---|---|---|
| 1,766,018 | 6/1930 | Flook | 198/484 |
| 3,802,547 | 4/1974 | Wagers, Jr. et al. | 198/484 |
| 3,889,591 | 6/1975 | Noguchi | 221/171 X |
| 4,302,134 | 11/1981 | Johnson, Jr. et al. | 198/484 |

Primary Examiner—Joseph E. Valenza
Assistant Examiner—David A. Bucci
Attorney, Agent, or Firm—Richard A. Bachand; N. Rhys Merrett; Melvin Sharp

[57] ABSTRACT

The invention relates to an apparatus with the aid of which tubular transport containers (10) having a substantially U-shaped hollow cross-section for DIL housings can be aligned prior to their filling or emptying. The apparatus comprises a first storage space (22) for the transport containers to be filled or emptied and a second storage space (65) for filled or emptied transport containers. A transport means (32, 33) is provided with the aid of which the transport containers can be conveyed out of the first storage space into the second storage space. At least one alignment means (50, 51) is provided which is equipped with at least one compressed air nozzle and produces an air flow which is directed from below against a transport container on its way from the first storage space to the second storage space. Under the influence of this air flow the transport container assumes a defined position in which the DIL housings disposed therein can be removed or introduced into said container. The apparatus is used in the fabrication of components which are accommodated in DIL housings and is employed in all cases where during this fabrication the DIL housings must be removed from the transport containers and inserted into processing stations and after carrying out a processing step must be returned again to the transport containers.

8 Claims, 7 Drawing Figures

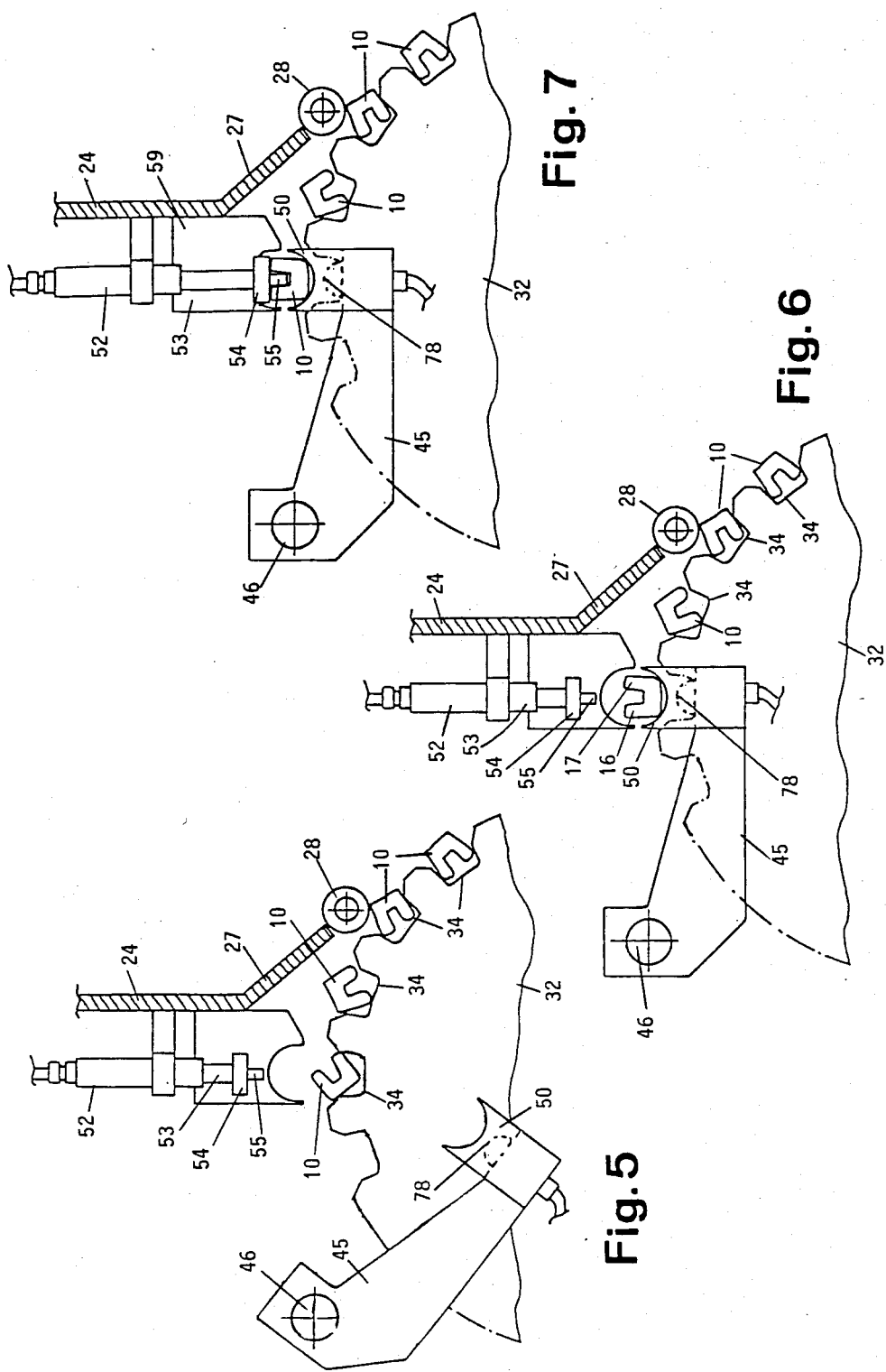

APPARATUS FOR ALIGNING TUBULAR TRANSPORT CONTAINERS HAVING A SUBSTANTIALLY U-SHAPED HOLLOW CROSS-SECTION FOR DIL HOUSING PRIOR TO THE EMPTYING OF SUCH TRANSPORT CONTAINERS

The invention relates to an apparatus for aligning tubular transport containers having a substantially U-shaped hollow cross-section for DIL housings prior to the filling or emptying of such transport containers, comprising a first storage space for the transport containers to be filled or emptied and a second storage space for the filled or emptied transport containers.

In the electronics industry large scale use is made of components accommodated in so called dual-in-line housings (DIL housings). In the production of such components, usually numerous processing steps must be carried out, for example the components contained in the DIL housings must be tested, and for distinguishing various components the respective type designations must be imprinted thereon. To facilitate handling the DIL housings are accommodated in special transport containers which have the form of elongated tubes having a substantially U-shaped hollow cross-section. Said transport containers accommodate the DIL housings in such a manner that in each case a row of the terminals projecting outwardly at the DIL housings is disposed in one leg of the U-shaped hollow cross-section whilst the housing body is in the connection region of the two U legs.

The finish tested components provided with type impressions are also filled into such special transport containers for dispatch.

In each processing step to be carried out the DIL housings have to be removed from the transport containers into which they are then again placed afterwards. To prepare for the actual discharge or filling the transport containers had to be brought by hand into a predetermined position so that on discharging they dispensed the DIL housings in the correct position to the respective processing station or on filling could accommodate the DIL housings coming from the processing station. The manual alignment of the transport containers was an operation highly undesirable in the overall production process of components in DIL housings.

The invention is now based on the problem of providing an apparatus of the type outlined at the beginning with the aid of which the alignment of the transport containers requires no intervention whatever by the operator.

According to the invention this problem is solved by a transport means for transporting the transport containers from the first storage space to the second storage space and at least one alignment means which is equipped with at least one compressed air nozzle for producing an air flow which is directed from below against a transport container on its way from the first storage space to the second storage space.

In the apparatus according to the invention the transport containers are engaged by the transport means in the first storage space and transported to the second storage space. On the way to the second storage space the alignment means acts on a transport container and directs an air flow against said transport container which is thereby moved automatically into a defined location in which it can be filled or discharged. This alignment takes place completely automatically under the action of the air flow without the operator having to intervene.

Advantageous further developments of the invention are characterized in the subsidiary claims.

Figure 2:
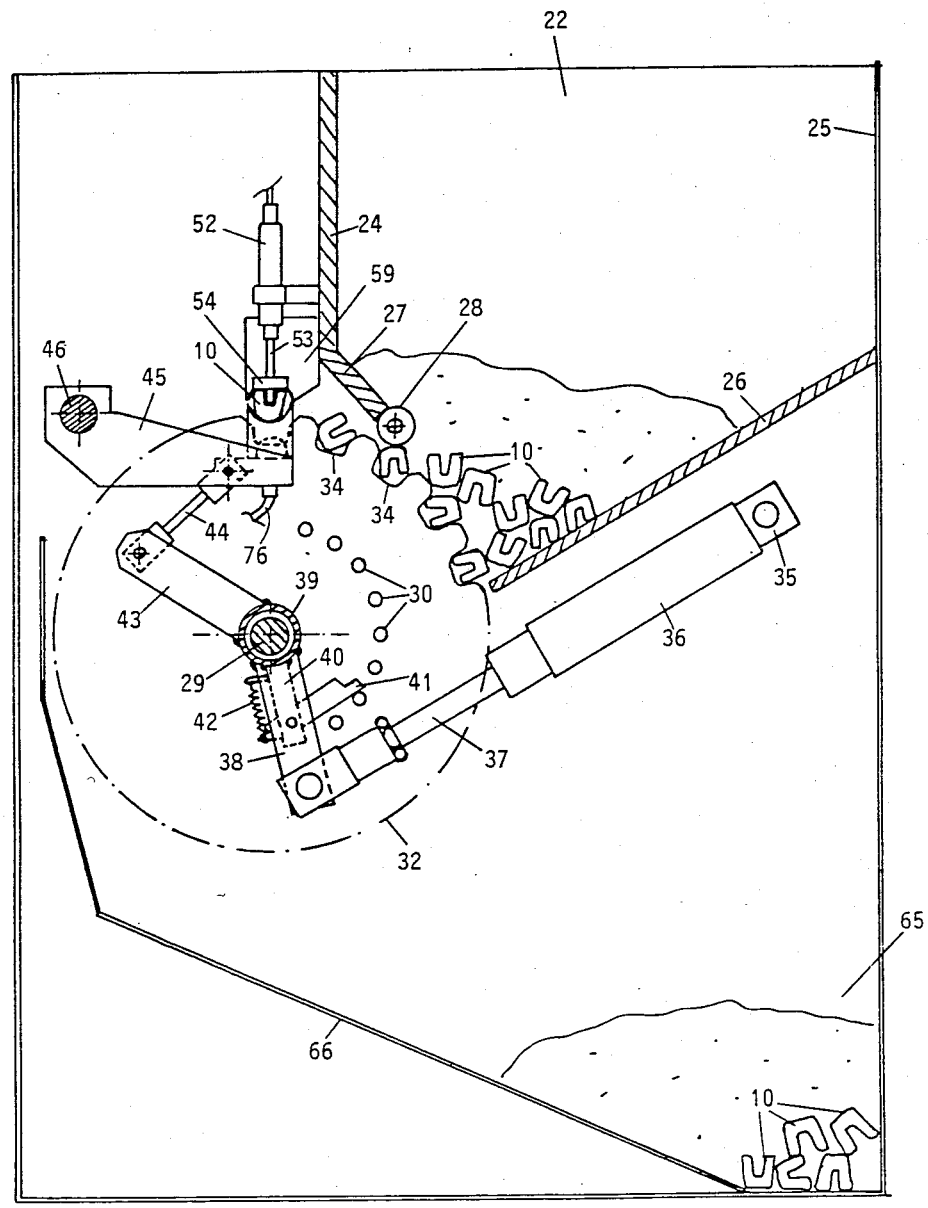
Figure 3:
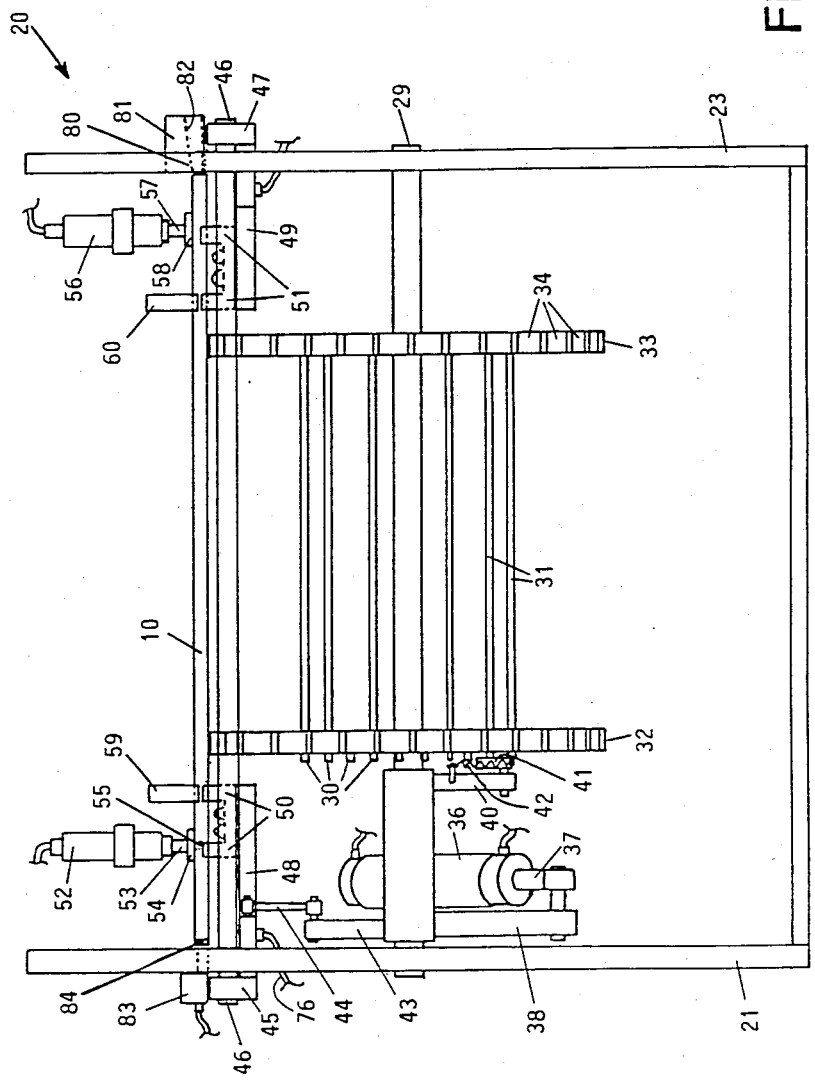
Figure 4:
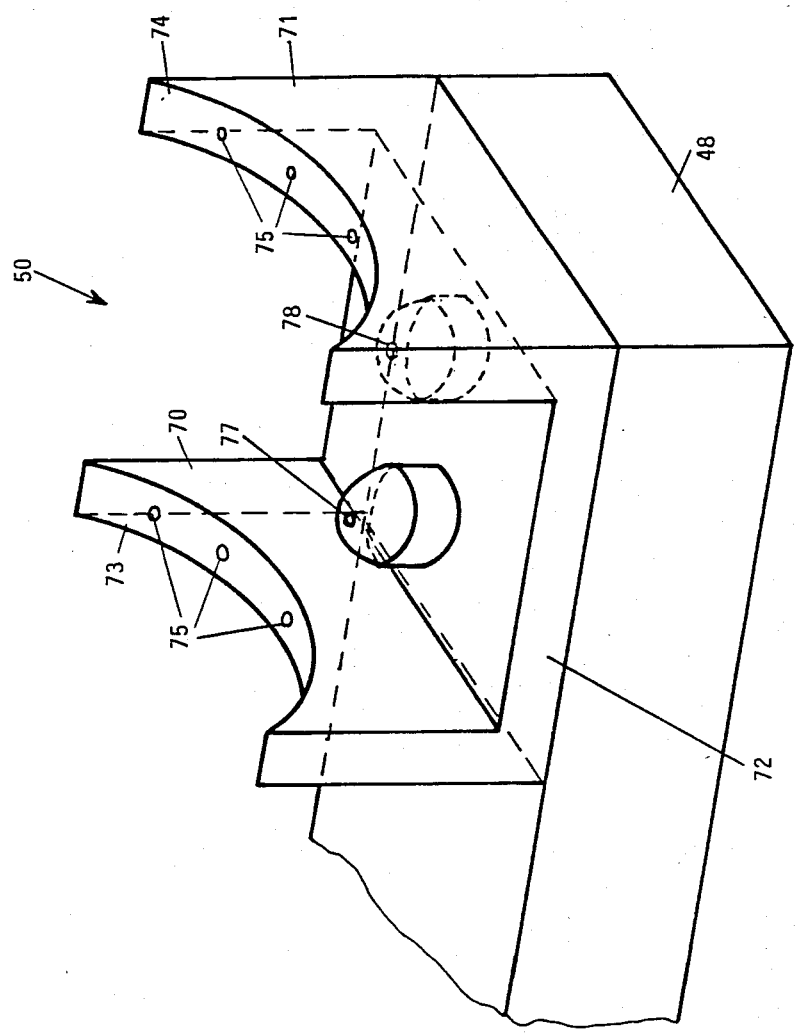

The invention will be described hereinafter with the aid of the drawings, wherein:

FIG. 1 is a view of part of a transport container for DIL housings and such a housing disposed in the container, FIG. 2 is a side view of an apparatus for charging abnd discharging transport containers according to FIG. 1, FIG. 3 is a rear view of the apparatus of FIG. 2, FIG. 4 is a detailed view of an alignment means used in the apparatus according to the invention and FIGS. 5–7 are three schematic representations of part of the apparatus according to the invention at three different instants of its operating cycle.

FIG. 1 illustrates part of a transport container 10 with the aid of which DIL housings containing electrical or electronic components such as integrated circuits, reed relays, switches and the like can be transported. The transport container 10 contains for illustration in FIG. 1 a DIL housing 11 having on each side four terminals 12. The transport container 10 consists of a tube of transparent plastic material which has a thin wall 13 which defines a substantial U-shaped cavity. The body 14 of the DIL housing 11 is in the connection region 15 of the U shape whilst in each case four terminals extend into one of the two U legs 16 and 17. A usual length of such transport containers 10 is 50.9 cm and then up to 49 DIL housings 11 of the type illustrated in FIG. 1 can be accommodated. In the web or connecting region 15 in the filled condition of the transport container 10 at both ends a plug, not illustrated, is inserted which prevents the DIL housings dropping out.

With the aid of the apparatus 20 illustrated in FIGS. 2 and 3 DIL housings 11 can be introduced into the transport container 10 or removed therefrom. This apparatus 20 is shown in FIG. 2 in side elevation when observed from the left side in FIG. 3 and assuming the side wall 21 to be transparent. For the subsequent description the apparatus 20 is to serve as filling means for the transport containers 10.

The empty transport containers 10 are disposed in a storage space which is defined by the side walls 21 and 23, a longitudinal wall 24, a portion of the front wall 25 and a downwardly sloping bottom 26. For inserting the empty transport containers 10 the storage space 22 is open at the top.

Adjoining the lower end of an angled portion 27 of the longitudinal wall 24 is a roller 28 which is rotated by a motor, not illustrated, in the anticlockwise direction in the illustration of FIG. 2. The purpose of this roller will become apparent hereinafter.

Extending between the side walls 21 and 23 is a shaft 29 which carries two transport discs 32, 33 interconnected by rods 31. At the periphery of the transport discs 32, 33 grooves are disposed which are deep enough to each accommodate a transport container 10, as apparent from FIG. 2.

Rotatably connected to the side wall 21 is one end 35 of a pneumatic drive motor 36. With the aid of this drive motor 36 a piston rod 37 can be advanced and retracted again through a predetermined distance. The piston rod 37 is articulately connected to an arm 38 which is non-rotatably connected to a bushing 39 mounted rotatably on the shaft 29. Connectedly fixed in rotation to said bushing 39 is a further arm 40 which carries a pawl 41 which is held by a spring 42 in engagement in each case with one transport pin 30 which is disposed at the left end face of the disc 32 in FIG. 3. On said end face of the disc 32 several such transport pins 30 are disposed at equal distances apart along a circle about the shaft 29 and serve in cooperation with the pawl 41 for rotating the discs 32 and 33 connected by the rods 31.

Mounted on the bushing 39 is a further arm 43 which is connected via a rod 44 articulately mounted on both sides to a lifting arm 45. The lifting arm is non-rotatably mounted on a shaft 46 which is rotatably mounted in the two side walls 21 and 23. The shaft 46 also carries a corresponding lifting arm 47 at its end lying at the side wall 23.

As apparent from FIG. 3, the lifting arms 45 and 47 lie partially outside the side walls 21 and 23 respectively and comprise portions 48, 49 which extend through openings in the side walls 21 and 23 into the interior of the apparatus 20.

At the ends lying inside the apparatus 20 the portions 48, 49 of the lifting arms 46, 47 each carry an alignment means 50 and 51 respectively whose structure will be explained in detail with the aid of FIG. 4.

Mounted above the alignment means 50 on the longitudinal wall 24 is a compressed-air operated adjustment cylinder 52 whose piston rod 53 carries an adjustment plate 54 and sensor pin 55 disposed on the front side thereof; when the transport container 10 is in the correct position, the sensor pin 55 extends between the U-legs 16 and 17 and permits a control of the correct position.

The alignment means 51 also has associated therewith an adjustment cylinder 56 which is mounted on the longitudinal wall 24 and operated by compressed air and the piston rod 57 of which carries an adjustment plate 58.

When the adjustment cylinders 52 and 56 are supplied with compressed air their respective piston rods displace the adjustment plates vertically downwardly in the direction towards the associated alignment means 50 and 51 respectively.

Associated with the two alignment means 50 and 51 and mounted on the longitudinal wall 24 adjacent the adjustment cylinders 52 and 56 are two holding members 59 and 60 whose purpose will become apparent hereinafter.

As apparent from FIG. 2 in the lower region of the apparatus 20 a further storage space 65 is disposed which is defined by a bottom 66 sloping downwardly with respect to the front wall 25. Said storage space 65 serves to receive transport containers which have been filled with DIL housings in the apparatus 20.

The enlarged view in FIG. 4 of the alignment means 50 shows the details of said means more clearly. The alignment means 50 is placed on the portion 48 of the lifting arm 45 disposed within the apparatus 20. Said means is made substantially U shaped and comprises two upwardly projecting legs 70 and 71 which are connected together by a web 72. The upper ends of the legs 70 and 71 have semicircular cutouts 73 and 74 respectively whose diameter is somewhat greater than the width of the transport container 10 as apparent in FIG. 2. Disposed in the legs 70 and 71 are passages which open into the atmosphere at openings 75 at the inner surfaces of the cutouts 73 and 74. The passages leading to the openings 75 are connected to a compressed air passage which is disposed in the portion 78 of the lifting arm 45 and to which compressed air can be supplied via a connection 76 apparent in FIGS. 2 and 3. The compressed air can also flow out through two nozzles 77 and 78 disposed in the centre of the web 72.

Said nozzles 77 and 78 are screwed into the web 72 and have a dome-shaped upwardly arched upper surface in the centre of which a hole is disposed out of which the air can flow.

The alignment means 51 is constructed in the same manner as the alignment means 50 and consequently a detailed description thereof would be superfluous.

As already indicated above, in the subsequent description of the mode of operation of the apparatus 20 it will be assumed that in the apparatus transport containers 10 are to be filled with DIL housings 11 of the type illustrated in FIG. 1 containing integrated circuits.

At the start of the operation empty transport containers which are open at one side are placed in the storage space 22. As apparent from FIG. 2 the transport containers 10 disposed in the lower region of the storage space 22 come into contact with the periphery of the discs 32, 33 and some of the transport containers 10 have already come to rest in the grooves 34 in undefined position. During an operating cycle the drive motor 36 is charged with compressed air so that it retracts the piston rod 37. As a result the arm 38 rotates the bushing 39 and thus also the arm 40 fixedly connected to said bushing 39 anticlockwise in the illustration of FIG. 2. As a result of the movement of the arm 40 the pawl meets one of the transport pins 30 projecting at the disc 32 so that said disc 32 and thus also the disc 33 connected fixedly thereto via the rods 31 is rotated about the shaft 29 in the anticlockwise direction.

The bushing 39 rotating in the anticlockwise direction also moves the arm 43 anticlockwise so that the latter, via the rod 44, lowers the lifting arm 45 from the position illustrated in FIG. 2 into the position indicated in FIG. 5. It is pointed out that in the initial stage of the operation no transport containers 10 are yet located in the grooves disposed in the upper region of the discs 32 and 33; several rotational steps of the discs 32 and 33 produced by the drive motor 36 via the pawl 41 in cooperation with the transport pins 30 must first be carried out before the first transport container 10 to enter a groove 34 in the storage space 22 reaches the uppermost position at the periphery of the discs 32 and 33.

The driven roller 28 ensures that only one transport container 10 is disposed in each groove 34. Because of its rotational movement in the anticlockwise direction in the illustration of FIG. 2, the roller 28 can separate transport containers 10 which may be intangled with each other.

FIG. 5 shows the condition at the end of a rotational step of the discs 32 and 33 carried out by retraction of the piston rods 37 of the drive motor 36 when a transport container 10 in a groove 34 has reached the uppermost position at the periphery of the discs 32 and 33. In this condition the lifting arm 35 is lowered to the greatest extent. The transport container 10 is in the uppermost groove 34 in a random position which is assumed on entering the groove 34 in the storage space 22.

In a following working step the drive motor 36 pushes the piston rod 37 out so that the bushing 39 with the arms secured thereto rotates clockwise about the shaft 29 in the illustration of FIG. 2. This rotational movement leads to the arm 43 by means of the rod 44 rotating the lifting arm 45 together with the shaft 46 in the anticlockwise direction. The shaft 46 thereby also moves the lifting arm 47 disposed at its other end.

During the movement of the lifting arms 45 and 47 the alignment means 50 and 51 are raised against the transport container 10 disposed in the groove 34 of the discs 32 and 33 at the top at that moment.

Shortly before the end of the movement of the lifting arms 45 and 47 the alignment means 50 and 51 engage the transport container 10 disposed in the uppermost groove 34 and lift said container 10 into the position illustrated in FIG. 6. It should be observed that the transport container 10 still has the random position illustrated in FIG. 5 when it comes into contact with the alignment means 50 and 51. The air emerging from the openings 75 and the nozzles 77 and 78 result in the transport container 10 turning under the action of gravity and the action of the air flows produced by the transport container form into the position illustrated in FIG. 6 in which the legs 16 and 17 project upwardly. The transport container 10 thus reaches a defined position in which the DIL housings 11 can be introduced into said transport container 10. To prevent the relatively light empty transport containers 10 from being blown out of the alignment means 50 and 51 by the air emerging from the openings 75 and the nozzles 77 and 78, the holding members 59 and 60 are disposed above the alignment means 50 and 51 respectively in such a manner that they engage the raised transport container 10 semicircularly.

When the transport container 10 to be filled at that instant has been raised to the position illustrated in FIG. 6 and brought into the defined position by the air flow, the adjustment cylinders 52 and 56 are actuated so that their piston rods 53, 57 lower the adjustment plates 54, 58 onto the transport container 10 disposed therebelow. This is illustrated in FIG. 7 with reference to the adjustment cylinder 52. The sensor pin 55 disposed at the lower side of the adjustment plate 54, together with the latter itself, holds the transport container exactly in the position illustrated in FIG. 7.

In the position illustrated in FIG. 7 the raised and aligned transport container 10 can now be filled with DIL housings 11. For the filling operation, a cutout 80 is disposed in the side wall 23 of the apparatus 20 into which a transfer member 81 is inserted. A passage 82 through the transfer member 81 leads towards the interior of the apparatus 20, and lies exactly on a level with the raised and aligned transport container 10. The cross-section of this end of the passage 82 is so dimensioned that a DIL housing 11 just passes therethrough. The passage 82 widens outwardly in funnel-like manner. By means not illustrated, for example using compressed air via slideways adjoining the passage 82, the DIL housings 11 can be introduced into the transport container. A previously defined number of DIL housings 11 just enough to fill the transport container 10 are supplied to the latter. This particular number is fixed at the output of the machine from which the DIL housings come, for example at the output of a printing machine in which type designations have been printed on the DIL housings.

When the transport container 10 is full the drive motor 36 is actuated by supplying compressed air so that it retracts its piston rod 37 which effects the rotational step of the discs 32 and 33 already outlined above about the shaft 30 with simultaneous lowering of the lifting arms 45 and 47. The adjustment cylinders 52 and 56 are also actuated so that they again retract their piston rods 53, 57. By the lowering of the lifting arms 45 and 47 the filled transport container 10 is again inserted into the groove 34 disposed therebelow and further conveyed by the discs 33 and 34 further moving through one rotational step in the anticlockwise direction in the illustration of FIG. 2, the next transport container 10 to be filled simultaneously coming into the uppermost position at the periphery of the disc 32 and 33.

The operations outlined are repeated for each transport container to be filled and the filled transport containers 10 finally drop out of the grooves 34 of the discs 32 and 33 and pass into the storage space 65 from which they can then be removed.

The apparatus 20 described can also be used for emptying filled transport containers 10. For this purpose the transfer member 81 is inserted into the side wall 23 turned through 180° so that the widened opening of the passage 82 points towards the transport container 10. In the emptying operation, a connection piece 83 disposed on the side wall 21 in alignment with the transport container 10 raised according to FIG. 3 or 7 serves to blow compressed air into the interior of the transport container 10 through an opening in the side wall 21. By means of this compressed air the DIL housings disposed in the transport container 10 are moved to the right in the illustration of FIG. 3 and pass outwardly through the passage 82 in the transfer member 81. Thus, in this use the storage space 22 contains the filled transport containers 10 and the empty transport containers are collected in the storage space 65.

It is pointed out that the transport containers 10, both in filling operation and in emptying operation, are sealed on one side by means of a plug which is inserted in the connection region 15 of the U form of the transport container. In FIG. 3 such a plug 84 is indicated diagrammatically at the left end of the transport container 10.

In filling operation said plug 84 facilitates the removal of the filled transport containers from the storage space 65 because it prevents the DIL housings 11 from dropping out at one end. After removal, all that is necessary is to provide a plug at the other end of the transport container 10 as well so that the DIL housings are held securely. In emptying operation the plug at the left side of the transport container 10 need not be removed because the compressed air blown into the transport container 10 for the emptying operation can readily penetrate through the open legs 16 and 17 of the U shape into the interior of the transport container 10.

What is claimed is:

1. Apparatus for aligning an elongated tubular container comprising:
    means for delivering said container;
    means for receiving said container from said delivering means and transporting said container to first and second locations;
    means adjacent said receiving and transporting means at said first location for engaging at least the ends of said container, and for temporarily lifting said container free from said receiving and transporting means, and thereafter returning said container to said receiving and transporting means, said engaging and lifting means having a semi-circular cutout in an upper edge thereof within which said container is received;

means at said first location for directing gas upward against said container for aligning said container to a desired alignment while said container is temporarily lifted from said receiving and transporting means;

means for clamping said aligned container within said semicircular cutout against said upper edge of said engaging and lifting means;

means for moving particles along a longitudinal center line of said tubular container while said container is clamped at said first position before said container is returned to said receiving and transporting means; and means at said second location for receiving said container from said receiving and transporting means after said container has been returned to said receiving and transporting means to store said container therein.

2. The apparatus of claim 1 wherein said receiving and transporting means comprises a pair of wheels each having a circumference with a plurality of notches therealong to receive respective first and second ends of said tubular container.

3. Apparatus as set forth in claim 2 wherein said nozzle directs said gas upward.

4. Apparatus as set forth in claim 2 wherein said nozzle is located on said engaging and lifting means adjacent the cutout in said engaging and lifting means.

5. A system for aligning a tubular container elongated along a longitudinal center line and having a substantially U-shaped cross section, comprising:

means for dispensing said container;

means carried adjacent said dispensing means for receiving said container and transporting it to a certain location;

means adjacent said receiving and transporting means at said certain location for engaging at least the ends of said container, and for lifting said container free from said receiving and transporting means;

said engaging and lifting means having a semi-circular cutout in an upper edge thereof within which said container is received;

a source of gas under pressure;

at least one nozzle located adjacent said certain location in pneumatic communication with said gas source for directing gas at said container for aligning said container to a predetermined alignment;

and means for clamping said aligned container within said circular cutout against said upper edge of said engaging and lifting means.

6. The system of claim 5 wherein said receiving and transporting means comprises a pair of wheels each having a circumference with a plurality of notches therealong to receiving respective first and second ends of said tubular container.

7. The system of claim 6 wherein said tubular container is adapted to contain Dil housings and further comprising means for moving Dil housings into and from the tubular container while said container is clamped at said certain location.

8. The system of claim 7 further comprising a gas source adjacent said certain location oriented to inject gas into said tubular container to move Dil housings therewithin.

* * * * *